United States Patent
Chen et al.

(10) Patent No.: US 7,402,755 B2
(45) Date of Patent: Jul. 22, 2008

(54) CIRCUIT BOARD WITH QUALITY-INDICATOR MARK AND METHOD FOR INDICATING QUALITY OF THE CIRCUIT BOARD

(75) Inventors: Chien-Te Chen, Taichung Hsien (TW); Chih-Hao Chang, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 267 days.

(21) Appl. No.: 10/935,870

(22) Filed: Sep. 7, 2004

(65) Prior Publication Data
US 2005/0247481 A1 Nov. 10, 2005

(30) Foreign Application Priority Data
May 6, 2004 (TW) .................. 093112723

(51) Int. Cl.
*H05K 1/00* (2006.01)
(52) U.S. Cl. .................. 174/250; 174/260; 174/261
(58) Field of Classification Search .................. 174/250, 174/260–266; 361/792–795, 741
See application file for complete search history.

(56) References Cited
U.S. PATENT DOCUMENTS
7,081,590 B2 * 7/2006 Yuzawa ...................... 174/250
2004/0245617 A1 * 12/2004 Damberg et al. ............. 257/686
2005/0121225 A1 * 6/2005 Hsu ............................ 174/255
2005/0284657 A1 * 12/2005 Ryu et al. .................... 174/262

* cited by examiner

Primary Examiner—Dean A. Reichard
Assistant Examiner—Abiy Getachew
(74) Attorney, Agent, or Firm—Peter F. Corless; Steven M. Jensen; Edwards Angell Palmer & Dodge LLP

(57) ABSTRACT

A circuit board with a quality-indicator mark and a method for indicating quality of the circuit board. The circuit board includes a plurality of circuit board units. A plating bus is formed around each circuit board unit and extended to form a plating trace in an inner-layer circuit structure of each circuit board unit. The inner-layer circuit structure is inspected in quality to maintain or break connection between the plating trace and plating bus if the quality is good or not. At least one circuit structure is formed on the inner-layer circuit structure and electrically connected to the plating trace to form a conductive mark on each circuit board unit. A metal protection layer is formed on the at least one circuit structure via the plating bus, and the conductive mark with the metal protection layer indicates that the inner-layer circuit structure of the circuit board unit is good.

9 Claims, 4 Drawing Sheets

CIRCUIT BOARD WITH QUALITY-INDICATOR MARK AND METHOD FOR INDICATING QUALITY OF THE CIRCUIT BOARD

FIELD OF THE INVENTION

The present invention relates to circuit boards with quality-indicator marks and methods for indicating the quality of the circuit boards, and more particularly, to a multi-layer circuit board formed on a surface thereof with a mark for indicating whether inner-layer circuits of the circuit board are good, and an indication method thereof.

BACKGROUND OF THE INVENTION

With development in the electronic industry, electronic products have been developed toward providing multiple functions and high performances. In order to achieve high integration and size miniaturization of a semiconductor package, a circuit board for carrying multiple active/passive components and circuits has evolved from a double-layer board to a multi-layer board, wherein an available circuit area of the multi-layer circuit board is enlarged via interlayer connection technology within a limited space for accommodating integrated circuits with a high circuit density.

Moreover, due to an increase in popularity of portable products such as communication, network and computer products etc., BGA (ball grid array) packages, flip-chip packages, CSPs (chip size packages) and MCM (multi chip module) packages have become mainstream products in the market as they are incorporated with size-reduced integrated circuits (ICs) and have a high density and a large number of leads or input/output (I/O) connections. These packages are usually cooperative with high capability chips such as microprocessors, chip modules and graphics chips etc. to achieve higher speed operation. However, fabrication limitations of an IC package substrate with circuits on the functions thereof, such as chip signal transmission, bandwidth improvement and control resistance, impede the use of such substrate in a package with a large number of I/O connections. As the package size is reduced to approximately the chip size, bow to develop a package substrate with fine circuits and a high density of fine vias is an important research task.

Accordingly, a conventional method for fabricating a multi-layer circuit board by using build-up technology has been provided. FIGS. 1A to 1D show a build-up method for fabricating a multi-layer circuit board, and this build-up method generally includes two steps: preparing a core and performing a circuit build-up process. Referring to FIG. 1A, first, a core 11 is prepared, which comprises a resin core layer 111 with a pre-determined thickness and circuits 112 formed on front and back surfaces of the resin core layer 111. A plurality of plated through holes 113 are formed in the resin core layer 111 to electrically connect the circuits 112 on the front and back surfaces of the resin core layer 111. Then referring to FIG. 1B, a build-up process is performed on the core 11 to form a dielectric resin layer 12 on the front and back surfaces thereof respectively, and the dielectric resin layer 12 is provided with a plurality of blind vias 13 for exposing portions of the circuits 112. Referring to FIG. 1C, a metal conductive film 14 is deposited on an exposed surface of the dielectric resin layer 12, side walls of the blind vias 13 and the exposed portions of the circuits 112 by means of an electroless plating or sputtering technique, and a patterned dry film 15 is formed on the metal conductive film 14. The patterned dry film 15 has a plurality of openings 150 for exposing portions of the conductive film 14 on which a patterned circuit layer is to be formed. Finally referring to FIG. 1D, a patterned circuit layer 16 is formed in the openings 150 of the dry film 15 by an electroplating technique, wherein the patterned circuit layer 16 is electrically connected to the circuits 112 through the blind vias 13, and then the dry film 15 and the part of the conductive film 14 covered by the dry film 15 are removed by etching, such that a build-up structure 10a is fabricated on each of the front and back surfaces of the core 11 so as to achieve a 1+2+1 substrate 10 with multi-layer circuitry (i.e. 2 build-up structures and a double-layer core). Similarly, the above build-up process may be repeated to form a second build-up structure on the build-up layer 10a (referred to as "first build-up structure") so as to fabricate a 2+2+2 substrate with multi-layer circuitry. Related prior arts include U.S. Pat. Nos. 5,837,427, 5,994,771 and 6,384,344.

Subsequently, BGA semiconductor packaging processes are readily performed, which allow a semiconductor chip to be mounted on a front surface of the foregoing substrate with desirable circuitry, and allow a plurality of solder balls to be implanted on a back surface of the substrate, wherein the solder balls are used to electrically connect the BGA package to an external electronic device such as printed circuit board (PCB). In order to reduce the weight and size of electronic products, there is provided a TFBGA (thin and fine ball grid array) package having a smaller overall size than the conventional BGA package. The TFBGA packages are normally fabricated in a batch manner on a substrate strip, wherein the substrate strip is predefined with a plurality of package sites each for forming a single TFBGA package. A singulation process is finally performed to separate apart the plurality of package sites to form a plurality of individual TFBGA packages.

Generally to provide electrical connection and bonding of a semiconductor package to an external electronic device (such as PCB) via solder balls, or provide efficient electrical connection of a semiconductor chip to a substrate, a plurality of conductive traces such as copper traces are formed on surfaces of the substrate and extended to form connecting pads where a nickel/gold metal layer is applied to allow conductive elements, such as gold wires, bumps or solder balls to be effectively bonded to the connecting pads of the substrate and electrically connect the substrate to the chip or PCB, and also to prevent the connecting pads from oxidization due to external environmental influences. For forming the nickel/gold metal layer having high electrical conductivity, during the fabrication of the substrate, the connecting pads are adapted to be electrically connected to a plating bus, such that a plating current can go through the plating bus to the connecting pads and allow the nickel/gold metal layer to be deposited on the connecting pads. When the semiconductor package is fabricated, the plating bus becomes useless and is removed.

A layout method of the TFBGA substrate is shown as FIG. 2. The TFBGA substrate 200 is divided into a plurality of substrate units 20 by a plurality of transverse cutting lines SLx and a plurality of longitudinal cutting lines SLy. The substrate units 20 serve as package sites to be subjected to subsequent packaging processes and would be separated from each other by means of a final singulation process cutting along the cutting lines SLx and SLy. A circuit layout of each substrate unit 20 includes a plurality of bonding pads 21, a plurality of conductive through holes 22, and a plurality of conductive traces 23 electrically connected to the bonding pads 21 and the conductive through holes 22. The conductive through holes 22 are used to electrically connect the conductive traces 23 on a front surface of the substrate unit 20 to ball pads (not shown) on a back surface of the substrate unit 20. In order to electroplate a nickel/gold metal layer on the bonding pads 21 on the front surface and the ball pads on the back surface of the substrate unit 20, the conductive through holes 22 are adapted to be electrically connected to a plating bus 24 formed around each substrate unit 20, so that a plating current can go through the plating bus 24 to all the conductive through holes 22 and then to the bonding pads 21 and the ball pads of the substrate unit 20. The plating bus 24 is formed in a grid shape and located on the cutting lines SLx and SLy, such that the plating bus 24 can be removed during the final singulation process. Related prior arts include U.S. Pat. Nos. 6,281,047, 6,319,750 and 6,479,894.

However, the above layout method for the substrate has a plurality of drawbacks. Since the plating bus is formed around the substrate units, before the substrate units are singulated, electrical tests cannot be performed on the substrate units. As a result, if inner-layer circuits of the substrate units generally for signal connection and grounding or powering purposes are incurred with defective appearance during the substrate fabrication, this situation would not be realized, and such substrate units would still be subjected to subsequent die-bonding and packaging processes if the substrate units have good outer-layer circuits and bonding pads or ball pads. This not only causes a waste of materials and cost but also leads to an increase in fabrication steps and time, as well as sacrifices the client's good dies due to fabrication of products with defective inner-layer circuits as it is incapable of detecting failure of the inner-layer circuits at an earlier stage.

Therefore, the problem to be solved here is to provide a method for indicating whether inner-layer circuits of a substrate are good and thus indicating whether the substrate should be subjected to subsequent packaging processes, so as to prevent a waste of materials and cost, an increase in fabrication steps and time, and sacrifice of the client's good dies from occurrence.

SUMMARY OF THE INVENTION

In light of the above drawbacks in the prior art, a primary objective of the present invention is to provide a circuit board with a quality-indicator mark and a method for indicating the quality of the circuit board, so as to effectively inspect whether inner-layer circuits of the circuit board are good during fabrication processes.

Another objective of the present invention is to provide a circuit board with a quality-indicator mark and a method for indicating the quality of the circuit board, which can avoid a waste of materials and an increase in fabrication cost for semiconductor packaging processes.

Still another objective of the present invention is to provide a circuit board with a quality-indicator mark and a method for indicating the quality of the circuit board, which can avoid unnecessary performance of steps and unnecessary usage of time for semiconductor packaging processes.

A further objective of the present invention is to provide a circuit board with a quality-indicator mark and a method for indicating the quality of the circuit board, so as to avoid the client's good dies being sacrificed.

In accordance with the above and other objectives, the present invention proposes a circuit board with a quality-indicator mark, comprising a plurality of circuit board units each having a multi-layer circuit structure; at least one conductive mark formed on a surface of each of the circuit board units; and a plating bus formed around each of the circuit board units, wherein the plating bus is electrically connected to the circuit structure of each of the circuit board units and is selectively electrically connected to the conductive mark via a plating trace formed in an inner-layer circuit structure of the circuit board unit and via interconnections in the circuit board unit.

The present invention also proposes a method for indicating quality of a circuit board with a quality-indicator mark. The method comprises the steps of: providing a circuit board having a plurality of circuit board units, wherein each of the circuit board units has an inner-layer circuit structure, and a plating bus is formed around each of the circuit board units and extended to form a plating trace in the inner-layer circuit structure; inspecting whether the inner-layer circuit structure of each of the circuit board units is good; if yes, maintaining the connection between the plating trace and the plating bus of the circuit board unit; if no, breaking the connection between the plating trace and the plating bus of the circuit board unit; and forming at least one circuit structure on the inner-layer circuit structure of each of the circuit board units, and forming a conductive structure on the plating trace to provide a conductive mark on a surface of the circuit board unit, as well as forming a metal protective layer via the plating bus on the at least one circuit structure of the circuit board unit, such that the conductive mark formed with the metal protective layer indicates that the corresponding circuit board unit has the plating bus being connected to the plating trace and the inner-layer circuit structure thereof is good.

In the use of the circuit board with a quality-indicator mark and the method for indicating quality of the circuit board in the present invention, if during the fabrication processes of the multi-layer circuit board, the inner-layer circuit structure of each circuit board unit is inspected having good quality, the electrical connection between the plating trace and the plating bus of the circuit board unit would be maintained. Then, at least one circuit structure is formed on the inner-layer circuit structure, and a conductive structure is provided on the plating trace and electrically connected to the conductive mark. During formation of the metal protective layer on the at least one circuit structure of the circuit board unit via the plating bus, the metal protective layer can also be formed on the conductive mark via the plating bus and the plating trace. This thus indicates that the inner-layer circuit structure is good and the corresponding circuit board unit can be subjected to subsequent die-bonding and packaging processes.

On the contrary, if during the fabrication processes of the multi-layer circuit board, the inner-layer circuit structure of the circuit board unit is inspected not having good quality, the electrical connection between the plating trace and plating bus of the circuit board unit would be broken. Then, at least one circuit structure is formed on the inner-layer circuit structure, and a conductive structure is provided on the plating trace and electrically connected to the conductive mark. During formation of the metal protective layer on the at least one circuit structure of the circuit board unit via the plating bus, since the electrical connection between the plating trace and the plating bus is broken, the metal protective layer would not be deposited on the conductive mark. This thus indicates that the inner-layer circuit is not good and the corresponding circuit board unit should not subjected to subsequent die-bonding and packaging processes so as not to cause a waste of materials and cost and an increase in fabrication steps and time, thereby assuring the client's rights and interests.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1A:
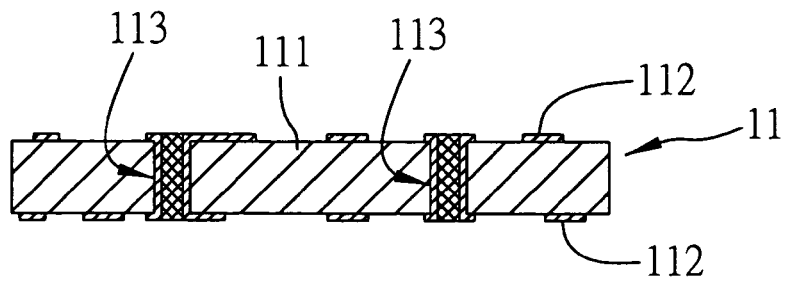
FIGS. 1A to 1D (PRIOR ART) are schematic cross-sectional diagrams showing procedural steps of a conventional fabrication method for a circuit board.
Figure 1B:
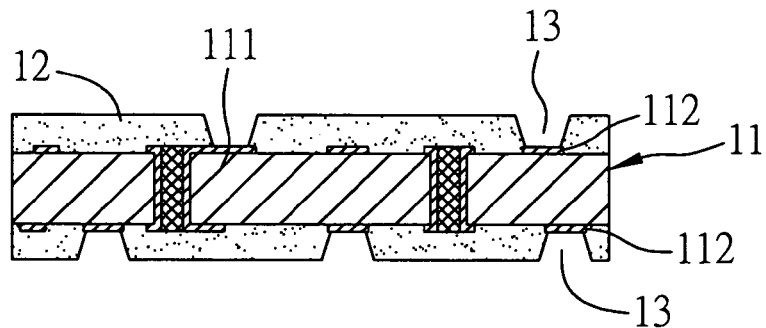
Figure 1C:
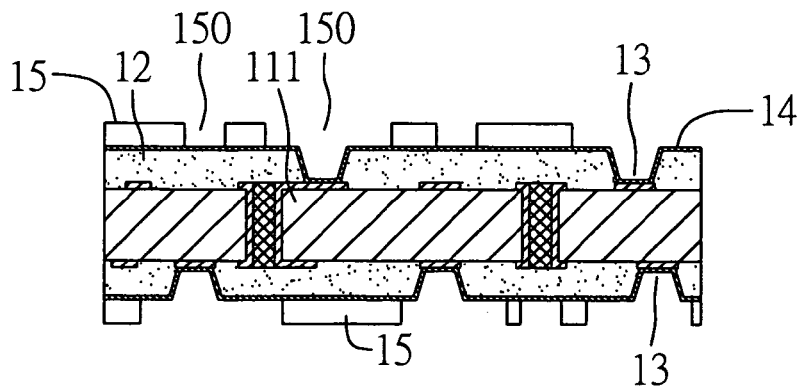
Figure 1D:
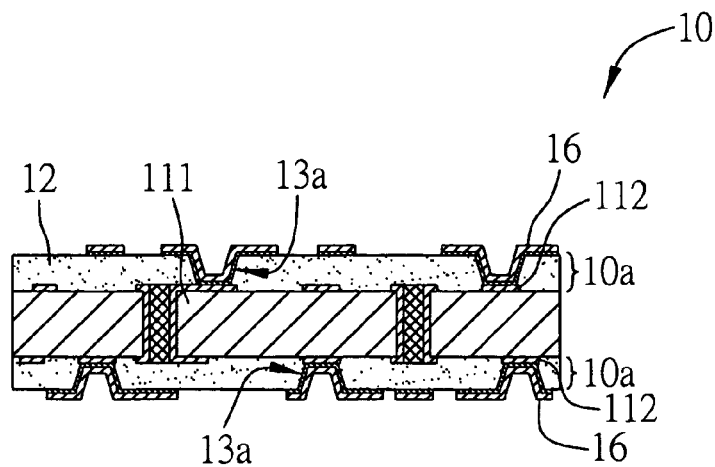
Figure 2:
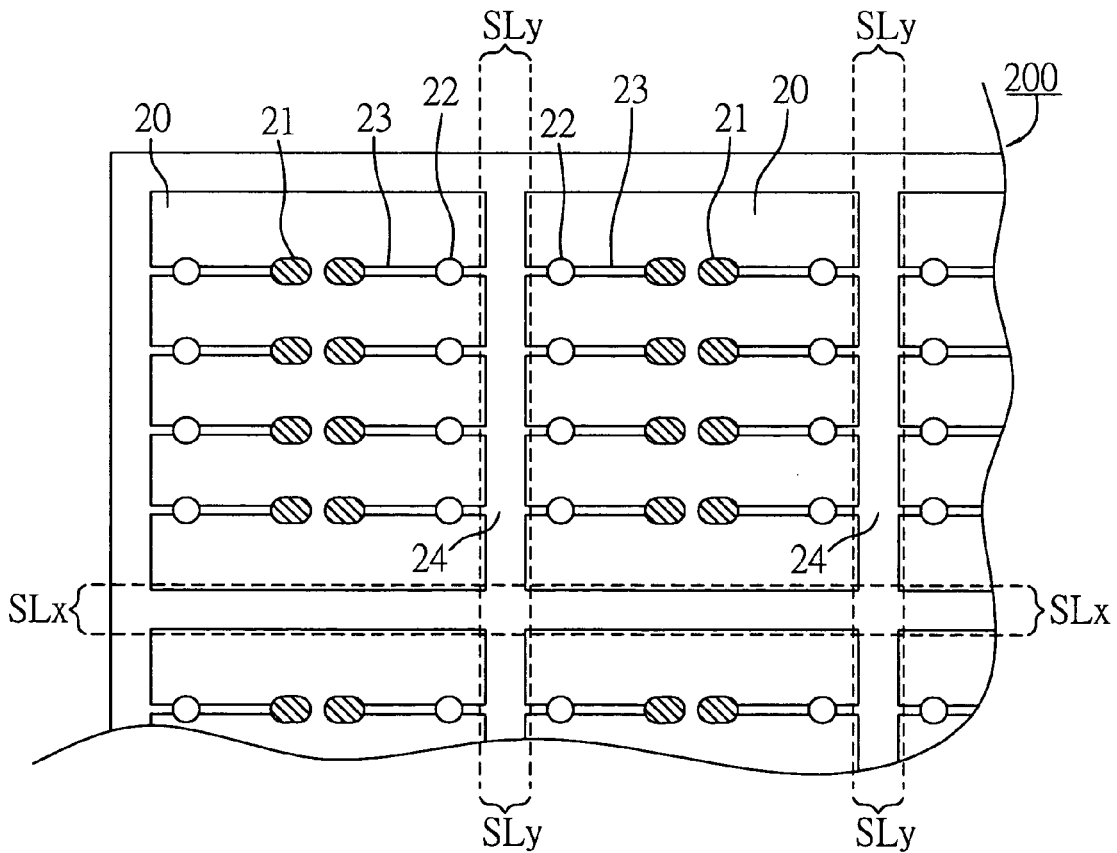
FIG. 2 (PRIOR ART) is a schematic diagram showing a circuit layout of a conventional TFBGA substrate.
Figure 3A:
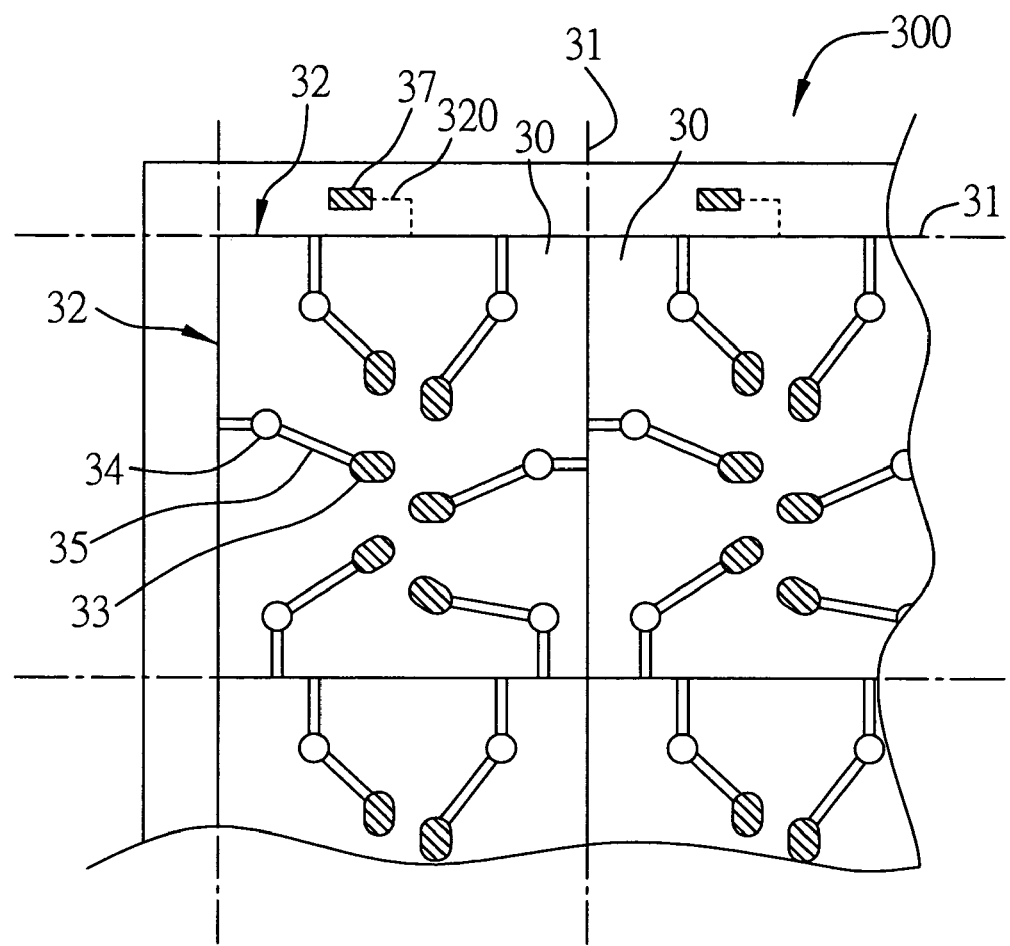
FIG. 3A is a schematic diagram of a circuit board with a quality-indicator mark according to the present invention.

FIG. 3A shows a circuit board with a quality-indicator mark according to the present invention. The circuit board 300 is a circuit board plate comprising a plurality of circuit board units 30 divided by a plurality of transverse and longitudinal cutting lines 31. A plating bus 32 is formed at the cutting lines 31 and encircles each of the circuit board units 30. The plating bus 32 is extended and electrically connected to circuit structures of the circuit board units 30, such as bonding pads 33, conductive vias 34, and conductive traces 35 that are extended and electrically connected to the bonding pads 33 and the conductive vias 34. The conductive vias 34 are used to electrically connect the bonding pads 33 on a front surface of the circuit board units 30 to ball pads (not shown) on a back surface of the circuit board units 30 via interconnections between layers of the circuit board units 30.

Figure 3B:
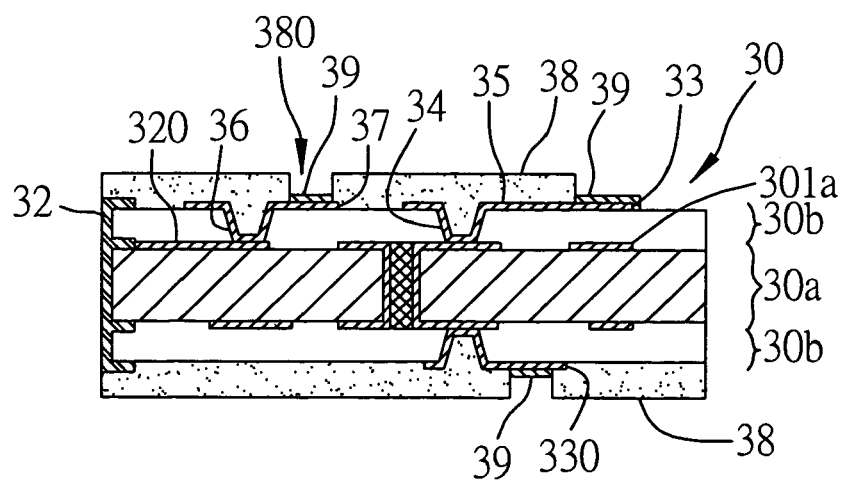
FIG. 3B is a cross-sectional view of a circuit board unit according to the present invention.

FIG. 3B is a cross-sectional view of a circuit board unit according to the present invention. The circuit board unit 30 has a multi-layer structure, including a core 30a and a build-up circuit layer 30b formed on each of front and back surfaces of the core 30a. The plating bus 32 is extended to form a plating trace 320 in an inner-layer circuit structure 301a of the circuit board unit 30 at the build-up circuit layer 30b on the front surface of the core 30a. A conductive via 36 is formed at a terminal of the plating trace 320. At least one conductive mark 37 is formed on the conductive via 36 and located at the build-up circuit layer 30b on the front surface of the core 30a. Subsequently, a solder mask layer 38 such as green paint can be applied on the front and back surfaces of the circuit board unit 30 to protect circuit structures on the surfaces of the circuit board unit 30. The solder mask layer 38 has a plurality of openings 380 for exposing the conductive mark 37 and input/output (I/O) connections (such as bonding pads 33 and ball pads 330) of the circuit board unit 30, wherein the exposed I/O connections are used to electrically connect the circuit board unit 30 to an external device (not shown). This allows a metal protective layer 39 such as nickel/gold metal layer to be electroplated on the exposed I/O connections and conductive mark 37 via the plating bus 32. It should be noted that beside the front surface of the circuit board unit 30 where the bonding pads 33 are situated, the conductive mark 37 can also be formed on the back surface of the circuit board unit 30 where the ball pads 330 are provided. Further, the conductive mark 37 can be located not only outside an area encompassed by the plating buses 32 (FIG. 3A) on the circuit board unit 30 but also within the area encompassed by the plating bus 32 not having a circuit layout of the circuit board unit 30. Moreover, the circuit board unit 30 is not limited to a four-layer circuit structure but may have any number of multiple circuit layers. Also, any one or more of the inner circuit layers of the multi-layer circuit board unit can be provided with plating traces electrically connected to the plating bus, allowing conductive marks to be formed on the surfaces of the circuit board unit and electrically connected to the plating traces via interconnections between layers of the circuit board unit.

Whether the plating trace 320 remains being electrically connected to the plating bus 32 or not is used to indicate whether inner-layer circuits of the circuit board are good or not in quality after the circuit board is fabricated and to determine whether subsequent die-bonding and packaging processes are to be performed on the circuit board. More specifically, during the fabrication of the circuit board, if the inner-layer circuit structure 301a of the circuit board unit 30 is visually inspected having good appearance, the electrical connection between the plating trace 320 formed in the inner-layer circuit structure 301a and the plating bus 32 is maintained as shown in FIG. 3B, allowing at least one build-up circuit layer 30b to be formed on the inner-layer circuit structure 301a, and allowing the conductive via 36 to be formed on the plating trace 320 and electrically connected to the conductive mark 37 on the surface of the circuit board unit 30. As such, the metal protective layer 39 can be subsequently electroplated on the bonding pads 33 or ball pads 330 of the circuit board unit 30 and also on the conductive mark 37 via the plating bus 32, as shown in FIGS. 3B and 4B. This thus indicates that the inner-layer circuit structure 301a of the circuit board unit 30 is good in quality, and the circuit board unit 30 can be subjected to subsequent die-bonding and packaging processes.

Figure 4A:
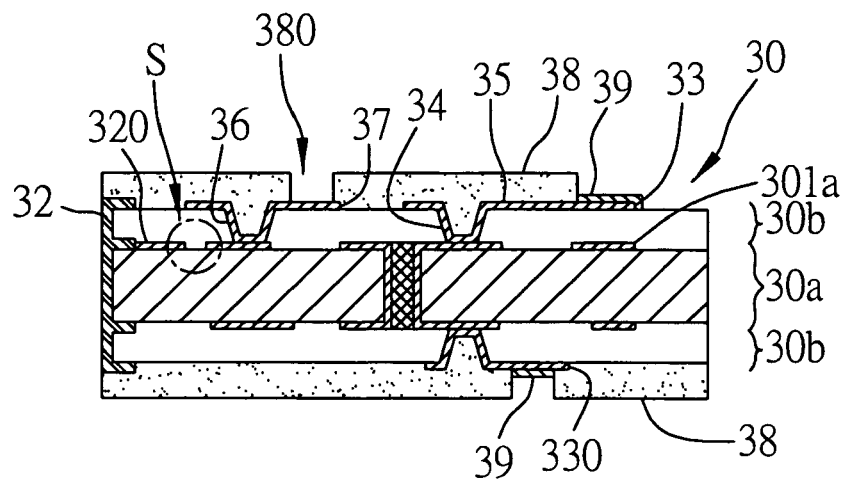
FIG. 4A is a cross-sectional view showing electrical disconnection between a plating trace and a plating bus in the circuit board unit according to the present invention.
Figure 4B:
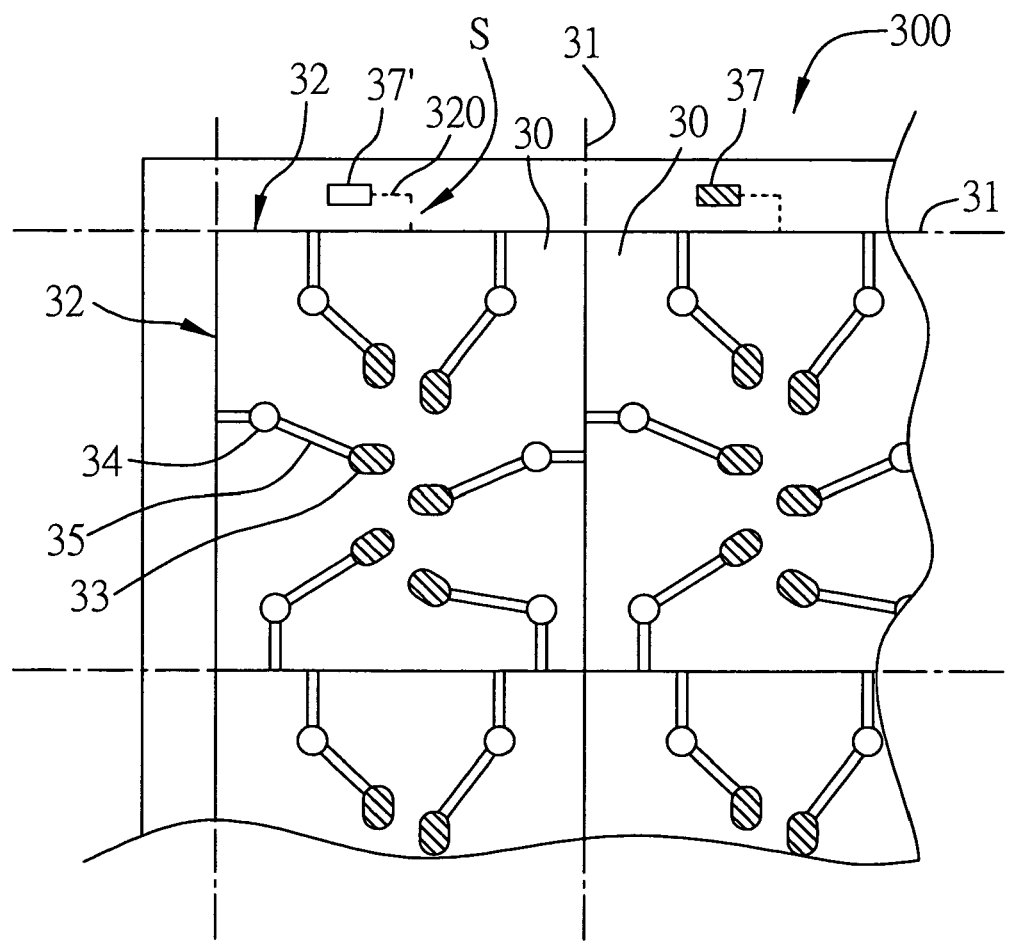
FIG. 4B is a schematic diagram showing failure to form a metal protective layer on a conductive mark during deposition of the metal protective layer on the circuit board unit via the plating bus.

Contrarily, if the inner-layer circuit structure 301a of the circuit board unit 30 is visually inspected not having good appearance during fabrication of the circuit board 300, the plating trace 320 formed in the inner-layer circuit structure 301a is electrically disconnected from the plating bus 32 to form an open circuit S, as shown in FIG. 4A. Subsequently, at least one build-up circuit layer 30b is formed on the inner-layer circuit structure 301a, and the conductive via 36 is formed on the plating trace 320 and electrically connected to a conductive mark 37' on the surface of the circuit board unit 30. During electroplating of the metal protective layer 39 on the bonding pads 33 or ball pads 330 via the plating bus 32, since the plating trace 320 and the plating bus 32 form the open circuit S, the metal protective layer 39 cannot be deposited on the conductive mark 37', as shown in FIG. 4B. This thus indicates that the inner-layer circuit structure 301a of the circuit board unit 30 is defective in quality, and the circuit board unit 30 should not undergo subsequent die-bonding and packaging processes so as not to cause a waste of materials and cost and an increase in fabrication steps and time, thereby avoiding the client's good dies being sacrificed.

The invention has been described using exemplary preferred embodiments. However, it is to be understood that the scope of the invention is not limited to the disclosed embodiments. On the contrary, it is intended to cover various modifications and similar arrangements. For example, the invention is not limited to the use with a TFBGA (thin flat ball grid array) semiconductor package but can be applied to any circuit board with a multi-layer circuit structure to indicate whether the inner-layer circuit structure thereof is good in quality and determine whether subsequently packaging processes are to be performed on the circuit board. The scope of the claims, therefore, should be accorded the broadest interpretation so as to encompass all such modifications and similar arrangements.

What is claimed is:

1. A circuit board with a quality-indicator mark, comprising:
   a plurality of circuit board units each having a multi-layer circuit structure;
   at least one conductive mark formed on a surface of each of the circuit board units; and
   a plating bus formed around each of the circuit board units, wherein the plating bus is electrically connected to the circuit structure of each of the circuit board units and is selectively electrically connected to the conductive mark via a plating trace formed in an inner-layer circuit structure of the circuit board unit and via interconnections in the circuit board unit,
   wherein a metal protective layer is formed on the conductive mark via the plating bus so that existence of the metal protective layer on the conductive mark shows a closed circuit between the plating trace formed in the inner-layer circuit structure and the plating bus, the circuit board unit includes a core and at least one build-up circuit layer formed respectively on front and back surfaces of the core, a conductive via is formned at a terminal of the plating trace, and the conductive mark is formed on the conductive via and located at the build-up circuit layer.

2. The circuit board of claim 1, further comprising a solder mask layer formed on surfaces of the circuit board and having a plurality of openings for exposing the conductive marks and input/output connections of the circuit board units.

3. The circuit board of claim 2, wherein the input/output connections include bonding pads and ball pads.

4. The circuit board of claim 2, wherein the input/output connections are plated with the metal protective layer via the plating bus.

5. The circuit board of claim 4, wherein the metal protective layer is a nickel/gold metal layer.

6. The circuit board of claim 1, wherein the circuit board units are divided by a plurality of transverse and longitudinal cutting lines, and the plating bus is formed at the transverse and longitudinal cutting lines.

7. The circuit board of claim 1, wherein the conductive mark is selectively formed on a front surface or a back surface of the circuit board unit.

8. The circuit board of claim 1, wherein the conductive mark is selectively located outside an area encompassed by the plating bus on the circuit board unit or within the area encompassed by the plating bus free of a circuit layout of the circuit board unit.

9. The circuit board of claim 1, wherein each inner circuit layer of the multi-layer circuit board unit is formed with a plating trace electrically connected to the plating bus.

* * * * *